(12) United States Patent
Clinton et al.

(10) Patent No.: US 8,508,974 B2
(45) Date of Patent: Aug. 13, 2013

(54) FERROELECTRIC MEMORY WITH SHUNT DEVICE

(75) Inventors: Michael Patrick Clinton, Allen, TX (US); Steven Craig Bartling, Plano, TX (US); Scott Summerfelt, Garland, TX (US); Hugh McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 140 days.

(21) Appl. No.: 13/240,420

(22) Filed: Sep. 22, 2011

(65) Prior Publication Data

US 2012/0170349 A1 Jul. 5, 2012

Related U.S. Application Data

(60) Provisional application No. 61/428,462, filed on Dec. 30, 2010.

(51) Int. Cl.
*G11C 11/22* (2006.01)
*G11C 5/06* (2006.01)
*G11C 7/00* (2006.01)

(52) U.S. Cl.
USPC .............. 365/145; 365/51; 365/65; 365/203

(58) Field of Classification Search
USPC ...................... 365/51, 65, 145, 203
See application file for complete search history.

(56) References Cited

U.S. PATENT DOCUMENTS

| | | | |
|---|---|---|---|
| 5,959,878 | A | 9/1999 | Kamp |
| 6,256,220 | B1 | 7/2001 | Kamp |
| 6,363,004 | B1 | 3/2002 | Kang et al. |
| 7,382,641 | B2 | 6/2008 | Kang et al. |
| 7,804,702 | B2 | 9/2010 | Madan |

*Primary Examiner* — Ly D Pham
(74) *Attorney, Agent, or Firm* — Alan A. R. Cooper; Wade J. Brady, III; Frederick J. Telecky, Jr.

(57) ABSTRACT

A ferroelectric memory device includes a shunt switch configured to short both sides of the ferroelectric capacitor of the ferroelectric memory device. The shunt switch is configured therefore to remove excess charge from around the ferroelectric capacitor prior to or after reading data from the ferroelectric capacitor. By one approach, the shunt switch is connected to operate in reaction to signals from the same line that controls accessing the ferroelectric capacitor. So configured, the high performance cycle time of the ferroelectric memory device is reduced by eliminating delays used to otherwise drain excess charge from around the ferroelectric capacitor, for example by applying a precharge voltage. The shunt switch also improves reliability of the ferroelectric memory device by ensuring that excess charge does not affect the reading of the ferroelectric capacitor during a read cycle.

13 Claims, 4 Drawing Sheets

US 8,508,974 B2

FERROELECTRIC MEMORY WITH SHUNT DEVICE

RELATED APPLICATIONS

This application claims the benefit of U.S. Provisional Application No. 61/428,462 filed Dec. 20, 2010, which is incorporated by reference in its entirety herein.

This application is related to co-pending, co-owned U.S. patent application Ser. No. 13/240,252 entitled Ferroelectric Memory Write-Back, filed Sep. 22, 2011; which is incorporated by reference in its entirety herein.

TECHNICAL FIELD

This invention relates generally to memory devices and more specifically to ferroelectric electric memory devices.

BACKGROUND

Various types of memory devices are known in the art for storing data used by various kinds of computing devices. Generally, memories include elements that can take one of two or more states wherein each state corresponds to a logical element used by an associated computing device. For example, many memory devices include elements that can be maintained in two states, one corresponding to a logic "zero" and a second corresponding to a logic "one." One example of a known memory device is a ferroelectric memory, also known as ferroelectric random access memory (FRAM or FeRAM). In a ferroelectric memory device, the element that can assume two states is a ferroelectric capacitor.

A ferroelectric capacitor, when biased with a voltage, maintains a stable electric potential when the bias voltage is removed. The ferroelectric capacitor can maintain this electric potential without application of an outside power source. So configured, a ferroelectric device based memory can maintain its stored state in the absence of the application of electricity, thereby making it a low-power option for a memory device. When a ferroelectric memory device is read, however, the state of the ferroelectric device is erased. To maintain the previous state, the ferroelectric element must be rewritten with the previous state after reading. This rewrite process can delay a cycle time for a ferroelectric device, thereby decreasing the speed at which ferroelectric memory device can operate. Moreover, it may be necessary to clear charge from a ferroelectric memory bit cell either at the end of a read cycle or at the beginning of a new read cycle. Clearing charge from the ferroelectric memory device is typically done by overlapping application of a pre-charge to a bit line with electrical connection of the ferroelectric capacitor for a time prior to starting reading of the ferroelectric capacitor. This process can delay the cycle time, which further degrades the speed performance for the memory device.

SUMMARY

Generally speaking, pursuant to these various embodiments, a ferroelectric memory device includes a shunt switch configured to short both sides of the ferroelectric capacitor of the ferroelectric memory device. The shunt switch is configured therefore to remove excess charge from around the ferroelectric capacitor prior to or after reading data from the ferroelectric capacitor. By one approach, the shunt switch is connected to operate in reaction to signals from the same line that controls accessing the ferroelectric capacitor. So configured, the high performance cycle time of the ferroelectric memory device is reduced by eliminating delays used to otherwise drain excess charge from around the ferroelectric capacitor. The shunt switch also improves reliability of the ferroelectric memory device by ensuring that excess charge does not affect the reading of the ferroelectric capacitor during a read cycle. These and other benefits may become clearer upon making a thorough review and study of the following detailed description.

BRIEF DESCRIPTION OF THE DRAWINGS

The above needs are at least partially met through provision of the ferroelectric memory write-back described in the following detail description, particularly when studied in conjunction with the drawings wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
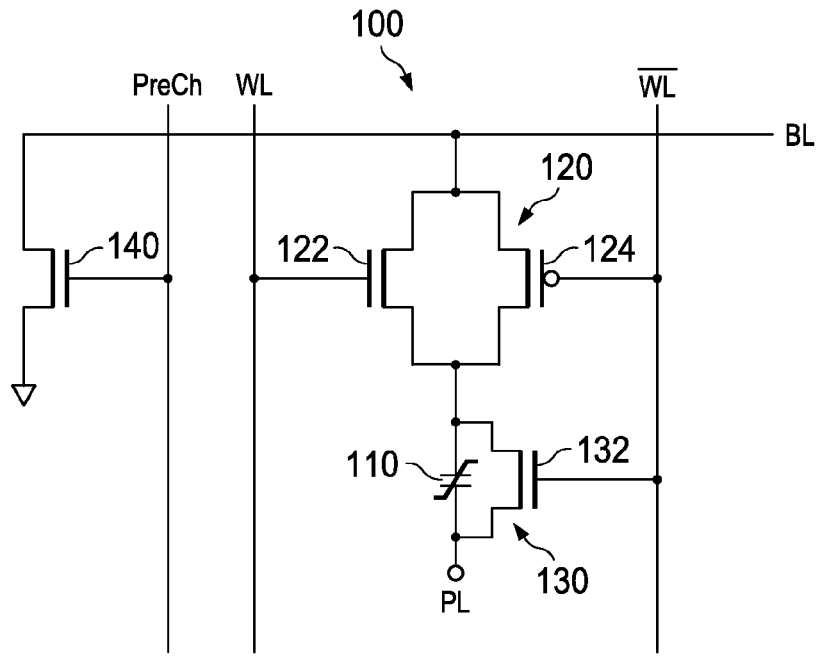
FIG. 1 comprises a circuit diagram of an example ferroelectric bit cell with a shunt device as configured in accordance with various embodiments of the invention.

With reference to FIG. 1, an example ferroelectric memory apparatus with a shunt device includes a bit cell 100 that includes a ferroelectric capacitor 110 electrically coupled to a plate line PL. A transmission gate 120 is coupled between the ferroelectric capacitor 110 and a bit line BL. The transmission gate 120 includes an nmos gate 122 electrically coupled to a word line WL and a pmos gate 124 electrically coupled to a compliment word line WL-bar. An nmos switch 130 is electrically coupled across the ferroelectric capacitor 110 with a gate 132 of the nmos switch 130 electrically coupled to the compliment word line WL-bar to shunt the ferroelectric capacitor 110 in response to deactivation of the compliment word line WL-bar. In one approach, the transmission gate 120 comprises cmos gate. In this example, a pre-charge switch 140 is electrically coupled to the bit line BL to selectively apply a pre-charge to the bit line BL in response to signaling received via a pre-charge line PreCh electrically coupled to a gate of the pre-charge switch 140. The pre-charge line PreCh is configured to activate and deactivate the pre-charge switch 140 at approximately a same time as deactivation and activation respectively of the compliment word line WL-bar.

Figure 2:
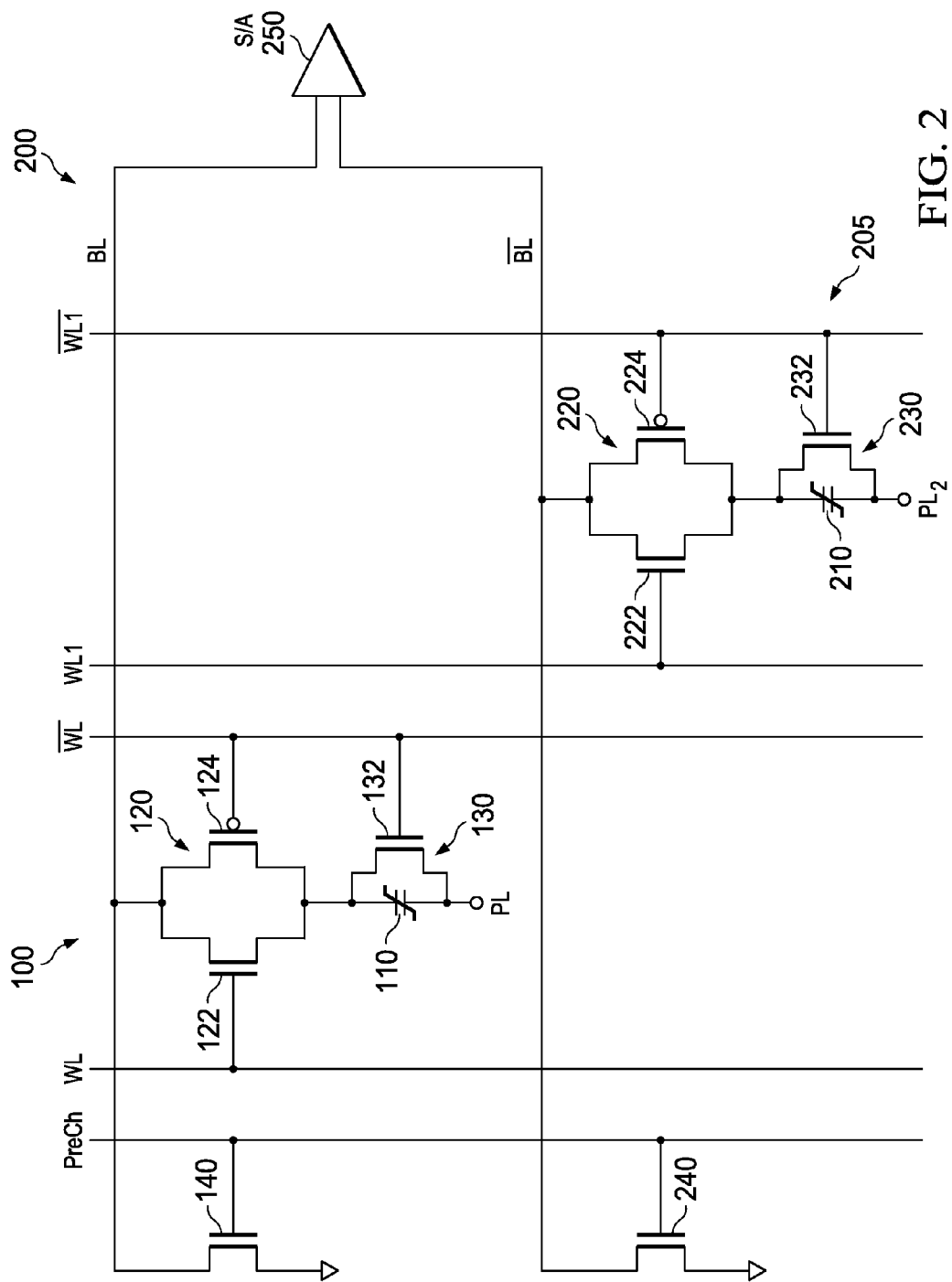
FIG. 2 comprises circuit diagram of an example dual bit cell ferroelectric memory device as configured in accordance with various embodiments of the invention.

With reference to FIG. 2, an example approach where the shunt switch is applied to a two capacitor bit cell will be described. The dual capacitor bit cell 200 includes a compliment bit cell 205 that includes a second ferroelectric capacitor 210 electrically coupled to a second plate line $PL_2$. A second transmission gate 220 is coupled between the second ferroelectric capacitor 210 and a compliment bit line BL-bar. The second transmission gate 220 includes a second nmos gate 222 electrically coupled to a second word line WL1 and a second pmos gate 224 electrically coupled to a second compliment word line WL1-bar. A second nmos switch 230 is electrically coupled across the second ferroelectric capacitor 210 with a second gate 232 of the second nmos switch 230 electrically coupled to the second compliment word line WL1-bar to shunt the second ferroelectric capacitor 210 in response to activation of the second compliment word line WL1-bar. In one approach, the word line WL and the second word line WL1 are tied together and operate together, and the compliment word line WL-bar and the second compliment word line WL1-bar are tied together and operate together to reduce signal controlling complexity. Similarly, the first plate line PL and the second plate line $PL_2$ can be tied together and operate together.

The sense amplifier 250 and the pre-charge line PreCh are common between the bit cell 100 and the compliment bit cell 205. A second pre-charge switch 240 is electrically coupled to the compliment bit line BL-bar to selectively apply a pre-charge to the compliment bit line BL-bar in response to signaling received via the pre-charge line PreCh electrically coupled to a gate of the pre-charge switch 240. The pre-charge line PreCh is configured to activate and deactivate the pre-charge switch 240 at approximately the same time as deactivation and activation respectively of the second compliment word line WL1-bar and the compliment word line WL0-bar. The ferroelectric memory apparatus 200 further includes a sense amplifier 250 electrically coupled to the bit line BL and the compliment bit line BL-bar to sense the voltage from the ferroelectric capacitors 110 and 210 to determine the state of the capacitors when reading the ferroelectric memory apparatus.

Figure 3:
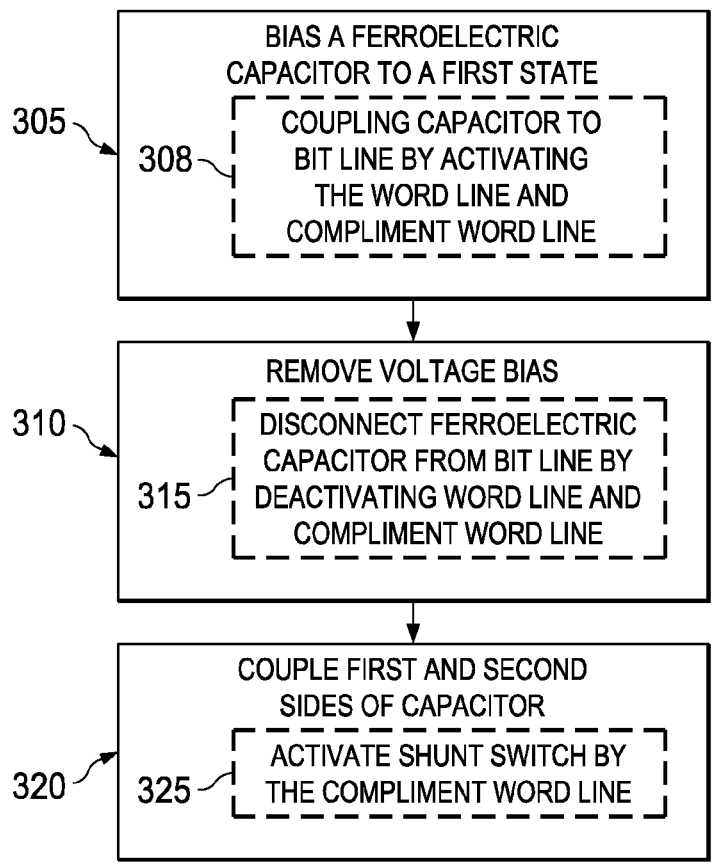
FIG. 3 comprises a flow chart of the operation of an example ferroelectric memory device incorporating a shunt switch as configured in accordance with various embodiments of the invention.

With reference to FIG. 3, a method of operating a ferroelectric device having a shunt device will be described. The method includes biasing 305 a ferroelectric capacitor to a first state by applying a voltage across the ferroelectric capacitor and removing 310 the voltage bias. In one approach, biasing the ferroelectric capacitor includes coupling 308 the ferroelectric capacitor to the bit line through the transmission gate by activating the word line and the compliment word line. The biasing may also include deactivating the shunt switch through activating the compliment word line. Removing 310 the voltage in one example includes electrically disconnecting 315 the ferroelectric capacitor from the bit line through a transmission gate by deactivating a word line and a compliment word line. The word line and the compliment word line are respectively electrically connected to gate elements of the transmission gate. At 320, a first side of the ferroelectric capacitor is electrically coupled to a second side of the ferroelectric capacitor through a shunt switch. The electric coupling in one approach is performed in response to activation 325 of the shunt switch by the compliment word line. So configured, electrically coupling a first side of the ferroelectric capacitor to a second side of the ferroelectric capacitor removes charge build up between the ferroelectric capacitor and the transmission gate in response to deactivation of the compliment word line.

By having the shunt switch controlled via signaling off the compliment word line, which also controls other aspects of the operation of the ferroelectric capacitor, the shunt switch is automatically controlled to provide minimum delays while achieving its purpose of minimizing excess charge around the ferroelectric capacitor. For example, the method of operating the ferroelectric memory device may include reading the first state from the ferroelectric capacitor. By one approach, reading the first state includes activating the word line and the compliment word line, which also deactivates the shunt switch. In another approach, the method includes applying a pre-charge to the bit line before activating the word line and the compliment word line, where activating the compliment word line deactivates the shunt switch. In still another approach, the method of operating the ferroelectric memory device may include applying the pre-charge to the bit line together with deactivating the word line and the compliment word line, which deactivating the compliment word line activates the shunt switch. So configured, the pre-charge need not be applied to the ferroelectric capacitor after activation of the word line to clear charge build up at the capacitor. Instead, the word line and the pre-charge line can be activated or deactivated concurrently thereby eliminating the delay time.

Figure 4:
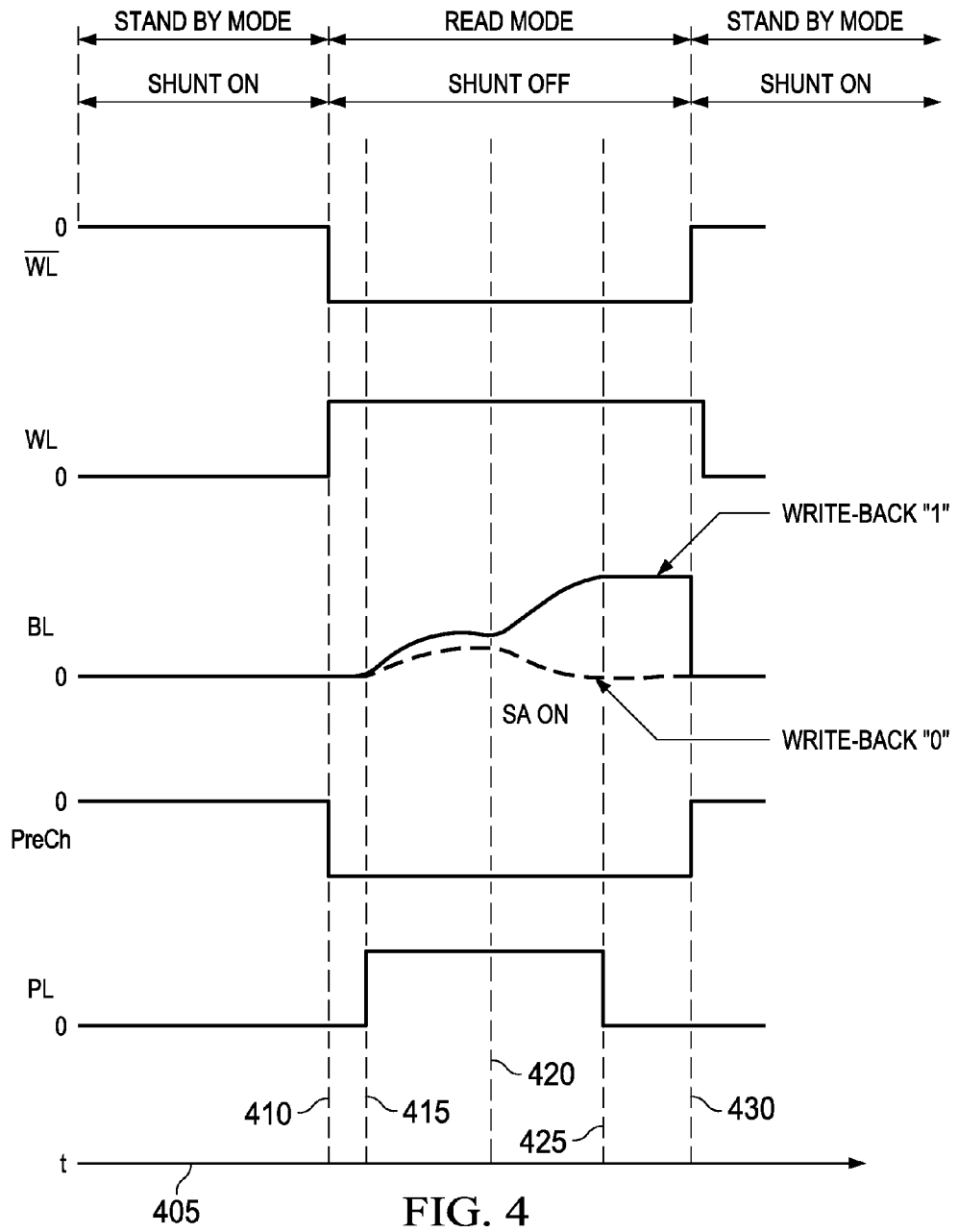
FIG. 4 comprises a signal diagram showing the signals at various points of the circuit of FIG. 2 over a common time period.

With reference to FIG. 4, this timing will be explained. FIG. 4 includes example signals for each of the compliment word line WL-bar, word line WL, bit line BL, pre-charge line PreCh, and plate line PL for an example operation of the ferroelectric memory device such as the example of FIG. 1. In the first time segment 405, the ferroelectric device is in a standby mode. During this state, the bit line BL is at zero as well as the plate line PL. The pre-charge line PreCh is activated to provide a pre-charge to the bit line BL, stabilizing the charge to the bit line BL during the standby mode. At time 410, the ferroelectric memory device is switched to a read mode in order to read the state of the ferroelectric capacitor at which time the word line WL and compliment word line WL-bar are activated and the pre-charge line PreCh is deactivated. By activating the compliment WL, the shunt switch is turned off, thereby removing the short across the ferroelectric capacitor. Shortly after time 410, the PL pulses at a time 415 to apply a voltage pulse to a ferroelectric capacitor, which in turn provides a signal on the bit line BL. This period of time between time 410 and 415 is thus called the WL drive time. Depending on the state of the ferroelectric capacitor, the bit line BL will provide a signal that corresponds to and identifies the previously state of the ferroelectric capacitor. Between time 415 and time 420, a signal develops on the bit line BL such that this time period is called the signal development phase. At time 420, the sense amplifier is turned on to sense the signal on the bit line BL. After sensing the signal on the bit line BL, a new data bit is stored in the ferroelectric capacitor by setting the ferroelectric capacitor to one of two states. The signal on the bit line BL during the read state indicates the relative signals for the example ferroelectric capacitor corresponding to a logical "one" or a logical "zero." At time 425, the plate line PL drops back to zero because the plate line PL pulsing is no longer necessary to read the state of the ferroelectric capacitor. At time 430, the pre-charge line PreCh activates at about the same time that the word line WL and the compliment word line WL deactivate. The shunt switch in turn is reactivated in response to the deactivation of the compliment word line WL. Accordingly the ferroelectric memory device is back in a stand by mode.

Figure 5:
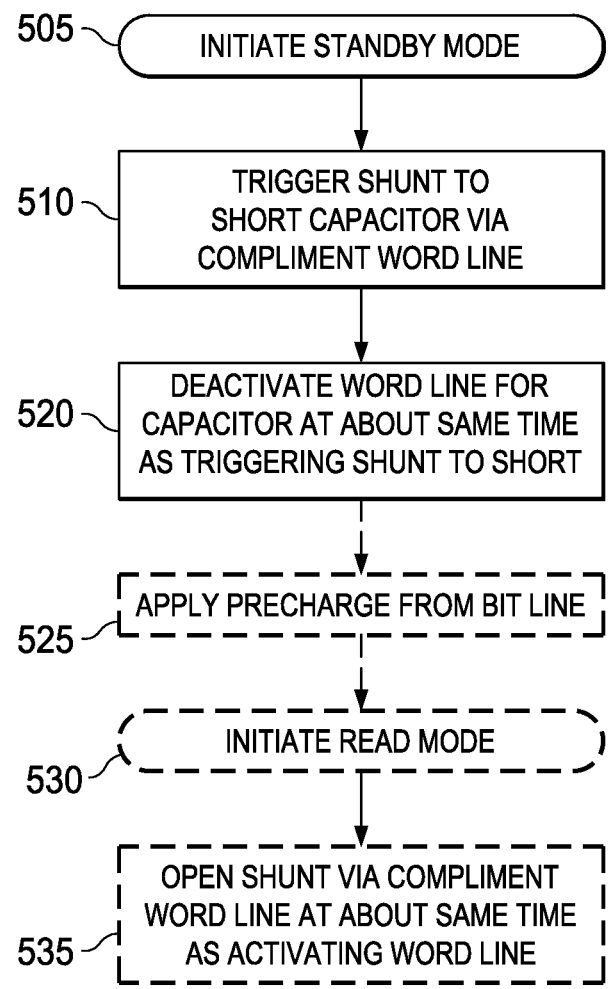
FIG. 5 comprises a flow diagram of an operation of an example ferroelectric memory device including a shunt switch as configured in accordance with various embodiments of the invention.

With reference to FIG. 5, a method of operating a ferroelectric memory device with a shunt switch between two states will be described. The method includes initiating 505 a standby mode of operation for a ferroelectric memory. The initiating includes triggering 510 a shunt device coupled across a ferroelectric capacitor to short a first side of the ferroelectric capacitor to a second side of the ferroelectric capacitor via a compliment word line for the ferroelectric capacitor electrically coupled to the shunt device. One approach to triggering the shunt device may include triggering an nmos coupled across the ferroelectric capacitor to short the first side of the ferroelectric capacitor to the second side of the ferroelectric capacitor via the compliment WL coupled to a gate of the nmos switch. The initiating the standby mode also includes deactivating 520 a word line for the ferroelectric capacitor at approximately a same time as triggering the shunt device via the compliment word line. Initiating the standby mode may also include 525 applying a pre-charge from a bit line for the ferroelectric capacitor after triggering the shunt device via the compliment word line. The method may further include initiating 530 a read mode for the ferroelectric memory by opening 535 the shunt device via the compliment word line at approximately the same time as activating the word line. By one approach initiating the read mode may further include applying a pre-charge to a bit line connected to the ferroelectric capacitor through a switch prior to activating the word line.

Although the flow charts of FIGS. 3 and 5 show a specific order of implementation, it is understood that the order may differ from that which is depicted, depending upon various factors such as, for example, the time it takes for various circuits to complete various tasks, etc. For example, the order of two or more blocks may be scrambled relative to the order shown. Also, two or more blocks shown in succession may be executed concurrently or with partial concurrence. It is understood that all such variations are within the scope of these teachings.

So configured with automatic triggering of the shunt device to clear charge with the compliment word line that switches at a mode switch, delays in cycle time previously required to clear charge from a standard FRAM bit cell either at the end of a read/write cycle or at the beginning of reading the bit cell are eliminated. Eliminating these delays can increase the read/write cycle time for a bit cell by as much as 10% to 15%. Having the shunt device eliminate excess charge build up between the ferroelectric capacitor and transmission gate, through which the ferroelectric capacitor is coupled to the bit line, increases the data integrity of the bit cell because the charge build up between the capacitor and gate will not have an opportunity to degrade the state stored on the ferroelectric capacitor. Moreover, the ferroelectric capacitor reliability is increased because this shunt approach eliminates the need to overlap application of a pre-charge to the bit line with opening the ferroelectric capacitor to the bit line, thereby eliminating the exposure of the ferroelectric capacitor to the pre-charge voltage.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. A method of operating a ferroelectric memory device, the method comprising:

biasing a ferroelectric capacitor to a first state by applying a voltage across the ferroelectric capacitor and removing the voltage;

wherein removing the voltage comprises electrically disconnecting the ferroelectric capacitor from a bit line through a transmission gate by deactivating a word line and a compliment word line, the word line and the compliment word line respectively electrically connected to gate elements of the transmission gate;

electrically coupling a first side of the ferroelectric capacitor to a second side of the ferroelectric capacitor through a shunt switch in response to activation of the shunt switch by the compliment word line;

wherein electrically coupling a first side of the ferroelectric capacitor to a second side of the ferroelectric capacitor removes charge build up between the ferroelectric capacitor and the transmission gate in response to deactivation of the compliment word line;

applying a pre-charge to the bit line at approximately a same time as activating the complement word line and removing the pre-charge to the bit line at approximately a same time as deactivating the complement word line.

2. The method of claim 1 wherein biasing the ferroelectric capacitor comprises coupling the ferroelectric capacitor to the bit line through the transmission gate by activating the word line and the compliment word line.

3. The method of claim 1 wherein biasing the ferroelectric capacitor comprises deactivating the shunt switch through activating the compliment word line.

4. The method of claim 1 further comprising reading the first state from the ferroelectric capacitor, wherein reading the first state comprises:

activating the word line and the compliment word line, which also deactivates the shut switch.

5. The method of claim 1 further comprising applying a precharge to the bit line before activating the word line and the complement word line, which activating the complement word line deactivates the shunt switch.

6. The method of claim 1 further comprising applying a precharge to the bit line together with deactivating the word line and the compliment word line, which deactivating the compliment word line activates the shunt switch.

7. A method comprising:

initiating a standby mode of operation for a ferroelectric memory, the initiating comprising:

triggering a shunt device coupled across a ferroelectric capacitor to short a first side of the ferroelectric capacitor to a second side of the ferroelectric capacitor via a compliment word line for the ferroelectric capacitor electrically coupled to the shunt device; and deactivating a word line for the ferroelectric capacitor at approximately a same time as triggering the shunt device via the compliment word line;

applying a precharge from a bit line for the ferroelectric capacitor after triggering the shunt device via the compliment word line.

8. The method of claim 7 further comprising initiating a read mode for the ferroelectric memory by opening the shunt device via the compliment word line at approximately a same time as activating the word line.

9. The method of claim 8 wherein initiating the read mode further comprises applying a precharge to a bit line connected to the ferroelectric capacitor through a switch prior to activating the word line.

10. The method of claim 7 wherein the triggering the shunt device comprises triggering an nmos switch coupled across the ferroelectric capacitor to short the first side of the ferroelectric capacitor to the second side of the ferroelectric capacitor via the compliment word line coupled to a gate of the nmos switch.

11. A ferroelectric memory apparatus comprising:
   a bit cell comprising:
      a ferroelectric capacitor electrically coupled to a plate line,
      a transmission gate coupled between the ferroelectric capacitor and a bit line, the transmission gate having an nmos gate electrically coupled to a word line and a pmos gate electrically coupled to a compliment word line, and
      an nmos switch electrically coupled across the ferroelectric capacitor with a gate of the nmos switch electrically coupled to the compliment word line to shunt the ferrocelectric capacitor in response to deactivation of the compliment word line; and
   a precharge switch electrically coupled to the bit line to selectively apply a precharge to the bit line in response to signaling received via a precharge line electrically coupled to a gate of the precharge switch, wherein the precharge line is configured to activate and deactivate the precharge switch at approximately a same time as deactivation and activation, respectively, of the compliment word line.

12. The ferroelectric memory apparatus of claim 11 wherein the transmission gate comprises a cmos gate.

13. The ferroelectric memory apparatus of claim 11 further comprising:
   a compliment bit cell comprising:
      a second ferroelectric capacitor electrically coupled to a second plate line;
      a second transmission gate coupled between the second ferroelectric capacitor and a compliment bit line, the second transmission gate having a second nmos gate electrically coupled to a second word line and a second pmos gate electrically coupled to a second compliment word line;
      a second nmos switch electrically coupled across the second ferroelectric capacitor with a second gate of the second nmos switch electrically coupled to the second compliment word line to shunt the second ferrocelectric capacitor in response to activation of the second compliment word line;
   the ferroelectric memory apparatus further comprising a sense amplifier electrically coupled to the bit line and the compliment bit line;
   wherein the sense amplifier, the word line, compliment word line, and precharge line are common between the bit cell and the compliment bit cell.

* * * * *